(12) United States Patent
Wu et al.

(10) Patent No.: US 10,575,439 B2
(45) Date of Patent: Feb. 25, 2020

(54) LIQUID COOLING APPARATUS AND LIQUID COOLING DEVICE

(71) Applicant: Huawei Technologies Co., Ltd., Shenzhen (CN)

(72) Inventors: Shengmei Wu, Shenzhen (CN); Kaijun Wu, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/282,671

(22) Filed: Feb. 22, 2019

(65) Prior Publication Data

US 2019/0223323 A1 Jul. 18, 2019

Related U.S. Application Data

(63) Continuation of application No. PCT/CN2017/081550, filed on Apr. 22, 2017.

(30) Foreign Application Priority Data

Sep. 9, 2016 (CN) .......................... 2016 1 0813230

(51) Int. Cl.
*H05K 7/20* (2006.01)
*G06F 1/20* (2006.01)
*F28F 9/02* (2006.01)

(52) U.S. Cl.
CPC ....... *H05K 7/20272* (2013.01); *F28F 9/0248* (2013.01); *G06F 1/20* (2013.01); *H05K 7/20* (2013.01); *H05K 7/20781* (2013.01)

(58) Field of Classification Search
CPC ..... H01L 23/473; H01L 23/4735; G06F 1/20; H05K 7/20772; H05K 7/20809; H05K 7/20336; H05K 7/20327; H05K 7/20509; H05K 7/20254; H05K 7/20781; H05K 7/20272; H05K 7/20936; H05K 7/2079; H05K 7/20763; H05K 7/20836; H05K 7/20263; H05K 7/20309; H05K 7/20318
See application file for complete search history.

(56) References Cited

U.S. PATENT DOCUMENTS 3,976,277 A * 8/1976 Basel ........................ F16K 7/06
251/7
5,584,340 A * 12/1996 Derosier ............... F28F 9/0131
165/149

(Continued)

FOREIGN PATENT DOCUMENTS

CN 106255389 A 12/2006
CN 202195204 U 4/2012

(Continued)

*Primary Examiner* — Adam B Dravininkas
(74) *Attorney, Agent, or Firm* — Slater Matsil, LLP (57) ABSTRACT

A liquid cooling apparatus and a liquid cooling device. The liquid cooling apparatus includes a rigid tube and a flexible tube, where the rigid tube is securely disposed in a cabinet and communicates with a liquid cooling source, and a through hole is opened in a side wall of the rigid tube and passes through the side wall, and one end of the flexible tube is in contact with the rigid tube and communicates with the rigid tube in a sealed manner by using the through hole, and the other end of the flexible tube communicates with a cooling tube in a blade server.

20 Claims, 10 Drawing Sheets

(56) References Cited

U.S. PATENT DOCUMENTS

| | | | | |
|---|---|---|---|---|
| 7,182,017 B1* | 2/2007 | Knepler | ............... | A47J 31/467 340/618 |
| 2007/0002536 A1* | 1/2007 | Hall | ................. | G06F 1/20 361/695 |
| 2008/0084664 A1* | 4/2008 | Campbell | ................. | G06F 1/20 361/699 |
| 2010/0252234 A1* | 10/2010 | Cambell | ................ | H01L 23/473 165/80.2 |
| 2012/0120605 A1* | 5/2012 | Arvelo | ..................... | G06F 1/20 361/702 |
| 2013/0043775 A1 | 2/2013 | Chen et al. | | |
| 2013/0107457 A1* | 5/2013 | Campbell | .......... | H05K 7/20272 361/699 |
| 2013/0120926 A1* | 5/2013 | Barina | ................ | H01L 23/4093 361/679.32 |
| 2013/0308267 A1 | 11/2013 | Wu et al. | | |
| 2016/0116224 A1* | 4/2016 | Shedd | .................. | F25B 41/003 165/104.22 |
| 2016/0120059 A1* | 4/2016 | Shedd | .................... | H05K 7/208 165/244 |
| 2016/0120071 A1* | 4/2016 | Shedd | ................ | H05K 7/20772 361/679.47 |
| 2016/0262284 A1 | 9/2016 | Ii et al. | | |

FOREIGN PATENT DOCUMENTS

| | | |
|---|---|---|
| CN | 103108526 A | 5/2013 |
| CN | 103907410 A | 7/2014 |
| CN | 204090416 U | 1/2015 |
| CN | 204650416 U | 9/2015 |
| CN | 205177816 U | 4/2016 |
| CN | 105764306 A | 7/2016 |
| CN | 205546363 U | 8/2016 |
| CN | 205566944 U | 9/2016 |
| JP | 2002130577 A | 5/2002 |
| JP | 2015124862 A | 7/2015 |

* cited by examiner

FIG. 12

LIQUID COOLING APPARATUS AND LIQUID COOLING DEVICE

CROSS-REFERENCE TO RELATED APPLICATIONS

This application is a continuation of International Application No. PCT/CN2017/081550, filed on Apr. 22, 2017, which claims priority to Chinese Patent Application No. 201610813230.9, filed on Sep. 9, 2016. The disclosures of the aforementioned applications are hereby incorporated by reference in their entireties.

TECHNICAL FIELD

The present disclosure relates to the machinery field, and in particular, to a liquid cooling apparatus and a liquid cooling device.

BACKGROUND

A blade server is disposed in a cabinet and may generate excessive heat during running, and therefore cooling is required for the blade server in the cabinet.

In a related technology, a liquid cooling device is used to cool a blade server in a cabinet. Specifically, the liquid cooling device may include a liquid cooling source and a liquid cooling module disposed in the cabinet. The liquid cooling module may include an inlet rigid tube, an outlet rigid tube, an inlet flexible tube, and an outlet flexible tube. The inlet rigid tube and the outlet rigid tube are both securely disposed in the cabinet. Both one end of the inlet rigid tube and one end of the outlet rigid tube communicate with the liquid cooling source, one end of the inlet flexible tube communicates with a side wall of the inlet rigid tube in a sealed manner by using a welded joint, one end of the outlet flexible tube communicates with a side wall of the outlet rigid tube in a sealed manner by using a welded joint, and the other end of the inlet flexible tube and the other end of the outlet flexible tube communicate with two ends of a cooling tube in the blade server, respectively. The liquid cooling source can import coolant to the inlet rigid tube, allowing the coolant to sequentially pass through the inlet flexible tube, the cooling tube, the outlet flexible tube, and the outlet rigid tube, and then return to the liquid cooling source. When the coolant passes through the cooling tube, the coolant can absorb heat generated by the blade server, thereby effectively cooling the blade server.

In the related technology, when a flexible tube communicates with a rigid tube in a sealed manner by using a welded joint, the flexible tube is coupled with a sealing ring and connected to a thread of the welded joint, and the welded joint is welded to the rigid tube, so that a sealed connection is formed between the welded joint and the flexible tube, and between the welded joint and the rigid tube. In other words, the flexible tube can communicate with the rigid tube in a sealed manner only after two sealed connections. If either sealed connection fails, coolant leakage may occur when the coolant flows between the rigid tube and the flexible tube, affecting normal operation of a liquid cooling device.

SUMMARY

To resolve a problem that when coolant flows between a rigid tube and a flexible tube, coolant leakage occurs and normal operation of a liquid cooling device is affected, the present disclosure provides a liquid cooling apparatus and a liquid cooling device. The technical solution is as follows.

According to a first aspect, a liquid cooling apparatus is provided, where the liquid cooling apparatus includes a rigid tube and a flexible tube, the rigid tube is securely disposed in a cabinet and communicates with a liquid cooling source, and a through hole is opened in a side wall of the rigid tube and passes through the side wall, and one end of the flexible tube is in contact with the rigid tube and communicates with the rigid tube in a sealed manner by using the through hole, and the other end of the flexible tube communicates with a cooling tube in a blade server.

The through hole passing through the side wall is opened in the side wall of the rigid tube in the liquid cooling apparatus, and one end of the flexible tube is in contact with the rigid tube and communicates with the rigid tube in a sealed manner by using the through hole. In other words, the rigid tube can communicate with the flexible tube in a sealed manner with only one sealed connection. This reduces a possibility of a sealed connection failure, decreases a probability of coolant leakage occurring when the coolant flows between the rigid tube and the flexible tube, and increases a probability of normal operation of a liquid cooling device.

Optionally, the liquid cooling apparatus further includes a nut strip securely disposed on an inner wall of the rigid tube, and a sealing ring coupled on one end of the flexible tube, where the nut strip is parallel to the rigid tube in a length direction, the nut strip is provided with a tapped hole passing through the nut strip, and the tapped hole communicates with the through hole, and one end of the flexible tube is connected to the tapped hole through threads by using the through hole, and the sealing ring is located between the flexible tube and the through hole.

Optionally, the rigid tube is a rectangular tube.

In the present disclosure, the rigid tube is a rectangular tube, the nut strip needs to be welded only inside the rigid tube, and relatively few welding positions are required for welding the nut strip. This reduces a quantity of welding positions and mitigates rigid tube deformation resulting from heating. In addition, in the embodiment of the present disclosure, relatively few positions need to be welded during a welding process, and if the nut strip cannot be used due to a manufacturing failure during a nut strip manufacturing process, the nut strip can be replaced directly. Costs of the nut strip are relatively low, thereby reducing manufacturing costs.

Optionally, the liquid cooling apparatus further includes a clamping part securely disposed in the cabinet, and a pin securely disposed on the side wall, where the pin includes a pin body and a protruding structure disposed on the pin body and away from one end of the rigid tube, and a cross-sectional area of the protruding structure vertical to a length direction of the pin body is greater than a cross-sectional area of the pin body vertical to the length direction of the pin body, and the clamping part is clamped to the pin body and is located between the rigid tube and the protruding structure. In other words, the rigid tube is securely disposed in the cabinet by using the clamping part and the pin.

Optionally, the rigid tube includes an inlet rigid tube and an outlet rigid tube, and the flexible tube includes an inlet flexible tube and an outlet flexible tube, where the inlet rigid tube and the outlet rigid tube both communicate with the liquid cooling source, and one end of the inlet flexible tube communicates with the inlet rigid tube in a sealed manner by using a through hole on a side wall of the inlet rigid tube, one end of the outlet flexible tube communicates with the outlet rigid tube in a sealed manner by using a through hole on a side wall of the outlet rigid tube, and the other end of the inlet flexible tube and the other end of the outlet flexible tube communicate with both ends of the cooling tube, respectively.

Optionally, an inner wall of the cabinet close to the rigid tube is a preset inner wall, any side wall of the inlet rigid tube is a first preset side wall, any side wall of the outlet rigid tube is a second preset side wall, the inlet rigid tube and the outlet rigid tube are both in contact with the preset inner wall, an angle between the preset inner wall and the first preset side wall is greater than 0 degrees and less than 90 degrees, and an angle between the preset inner wall and the second preset side wall is greater than 0 degrees and less than 90 degrees.

In the present disclosure, the inlet rigid tube and the outlet rigid tube are both disposed against the preset inner wall of the cabinet. To ensure sufficient space for arranging the inlet flexible tube connected to the inlet rigid tube and the outlet flexible tube connected to the outlet rigid tube, the inlet rigid tube and the outlet rigid tube are specially disposed to tilt at an angle, so that the inlet flexible tube and the outlet flexible tube can be arranged in sufficient space on a premise that the inlet rigid tube and the outlet rigid tube are both disposed against the preset inner wall. In addition, because the inlet rigid tube and the outlet rigid tube are both disposed against the preset inner wall, a width of the liquid cooling apparatus is relatively small, and the liquid cooling apparatus can be placed in a cabinet with a width of 600 millimeters. In a related technology, a cabinet with a width of 800 millimeters is relatively large, and equipment room space utilization is relatively low. However, a cabinet with a width of 600 millimeters is relatively small, and equipment room space utilization is relatively high. Because an inlet rigid tube and an outlet rigid tube are arranged in parallel, and only one rigid tube is disposed against a cabinet while the other rigid tube is not disposed against the cabinet, a liquid cooling apparatus is relatively wide and can be placed only in a cabinet with a width of 800 millimeters, but cannot be placed in a cabinet with a width of 600 millimeters.

Optionally, 2n blade servers are disposed in the cabinet, and the liquid cooling apparatus includes two liquid cooling sub-apparatuses, each of the liquid cooling sub-apparatuses includes one inlet rigid tube, one outlet rigid tube, n inlet flexible tubes, n outlet flexible tubes, n first sealing rings, and n second sealing rings, n first through holes are opened in a side wall of the inlet rigid tube, n first tapped holes are disposed on a nut strip on an inner wall of the inlet rigid tube, n second through holes are opened in a side wall of the outlet rigid tube, and n second tapped holes are disposed on a nut strip on an inner wall of the outlet rigid tube, where n is an integer greater than or equal to 1, the n inlet flexible tubes and the n outlet flexible tubes are in one-to-one correspondence, the n inlet flexible tubes, the n first sealing rings, the n first through holes, and the n first tapped holes are in one-to-one correspondence, and the n outlet flexible tubes, the n second sealing rings, the n second through holes, and the n second tapped holes are in one-to-one correspondence, and one end of each flexible tube is coupled with a corresponding sealing ring, and is connected to a corresponding tapped hole through threads by using a corresponding through hole, the other end of each inlet flexible tube and the other end of a corresponding outlet flexible tube communicate with both ends of a cooling tube in the same blade server, respectively, and any two inlet flexible tubes in the liquid cooling apparatus communicate with different cooling tubes.

Optionally, the rigid tube is a steel tube, a width of the cabinet is 600 millimeters, a length of the nut strip is 500 millimeters, and a maximum outer diameter of the tapped hole is 8 millimeters.

Optionally, the liquid cooling apparatus further includes a first manifold flexible tube and a second manifold flexible tube, and the inlet rigid tube communicates with the liquid cooling source by using the first manifold flexible tube, and the outlet rigid tube communicates with the liquid cooling source by using the second manifold flexible tube.

According to a second aspect, a liquid cooling device is provided, where the liquid cooling device includes a liquid cooling source and a liquid cooling apparatus, and the liquid cooling apparatus is the liquid cooling apparatus in the first aspect.

To sum up, the present disclosure provides a liquid cooling apparatus and a liquid cooling device. The through hole passing through the side wall is opened in the side wall of the rigid tube in the liquid cooling apparatus, and one end of the flexible tube is in contact with the rigid tube and communicates with the rigid tube in a sealed manner by using the through hole. In other words, the rigid tube can communicate with the flexible tube in a sealed manner with only one sealed connection. This reduces a possibility of a sealed connection failure, decreases a probability of coolant leakage occurring when the coolant flows between the rigid tube and the flexible tube, and increases a probability of normal operation of the liquid cooling device.

BRIEF DESCRIPTION OF THE DRAWINGS

To describe the technical solutions in the embodiments of the present disclosure more clearly, the following briefly describes the accompanying drawings required for describing the embodiments. Apparently, the accompanying drawings in the following description show merely some embodiments of the present disclosure, and a person of ordinary skill in the art may derive other drawings from these accompanying drawings without creative efforts.

DETAILED DESCRIPTION OF ILLUSTRATIVE EMBODIMENTS

To make the objectives, technical solutions, and advantages of the present disclosure clearer, the following further describes the embodiments of the present disclosure in detail with reference to the accompanying drawings.

Figure 1:
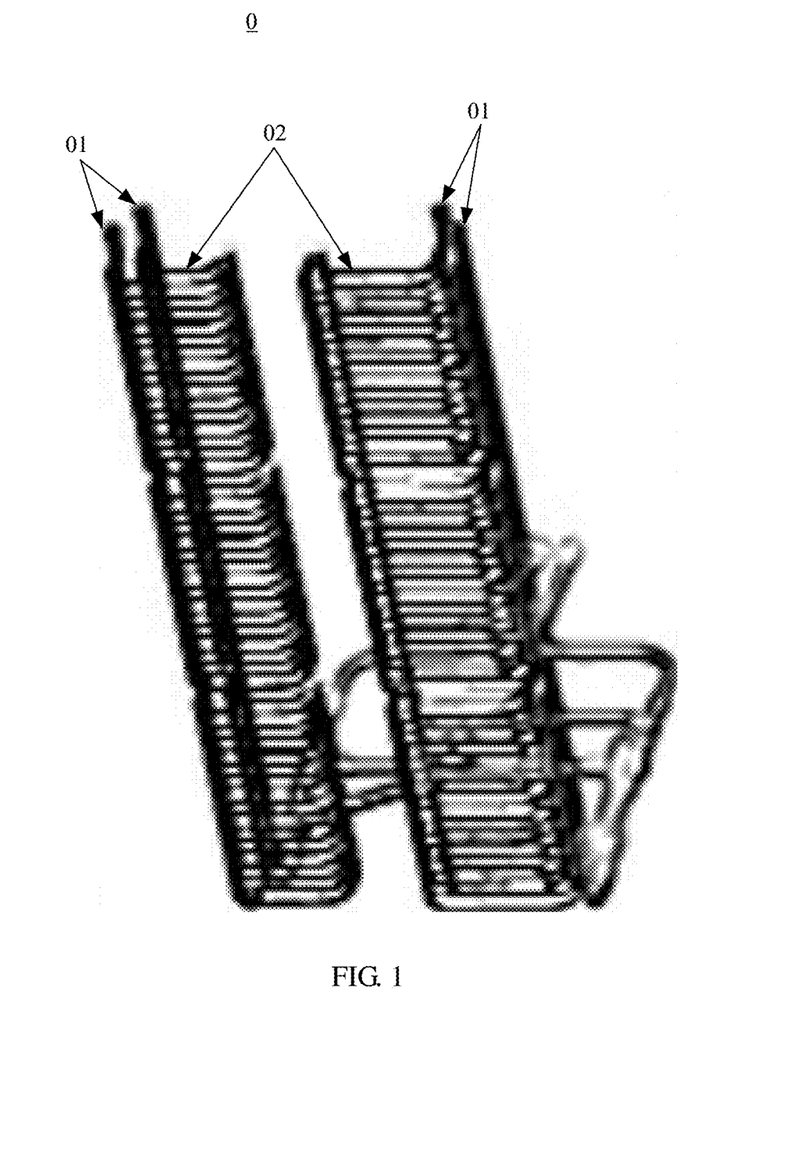
FIG. 1 is a schematic structural diagram of a liquid cooling module according to a related technology.
Figure 2:
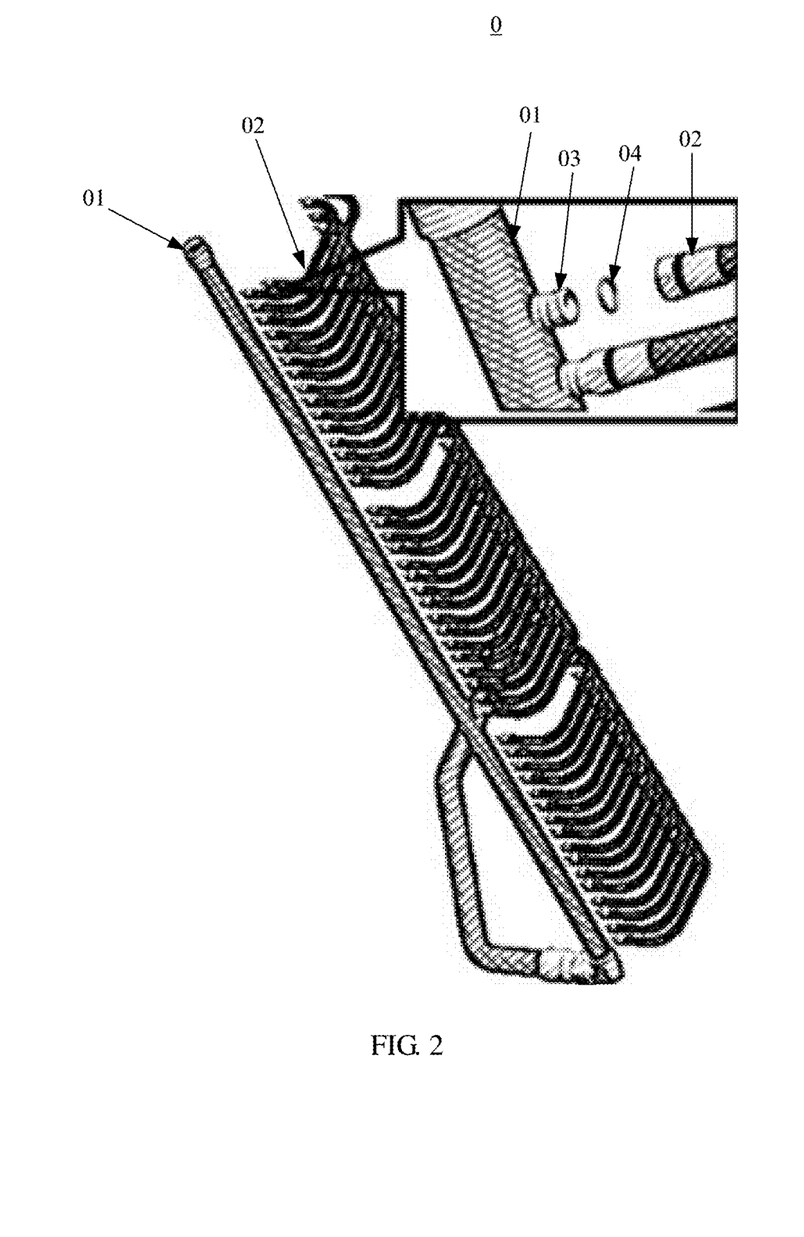
FIG. 2 is a schematic diagram of a partial structure of a liquid cooling module according to a related technology.
Figure 3:
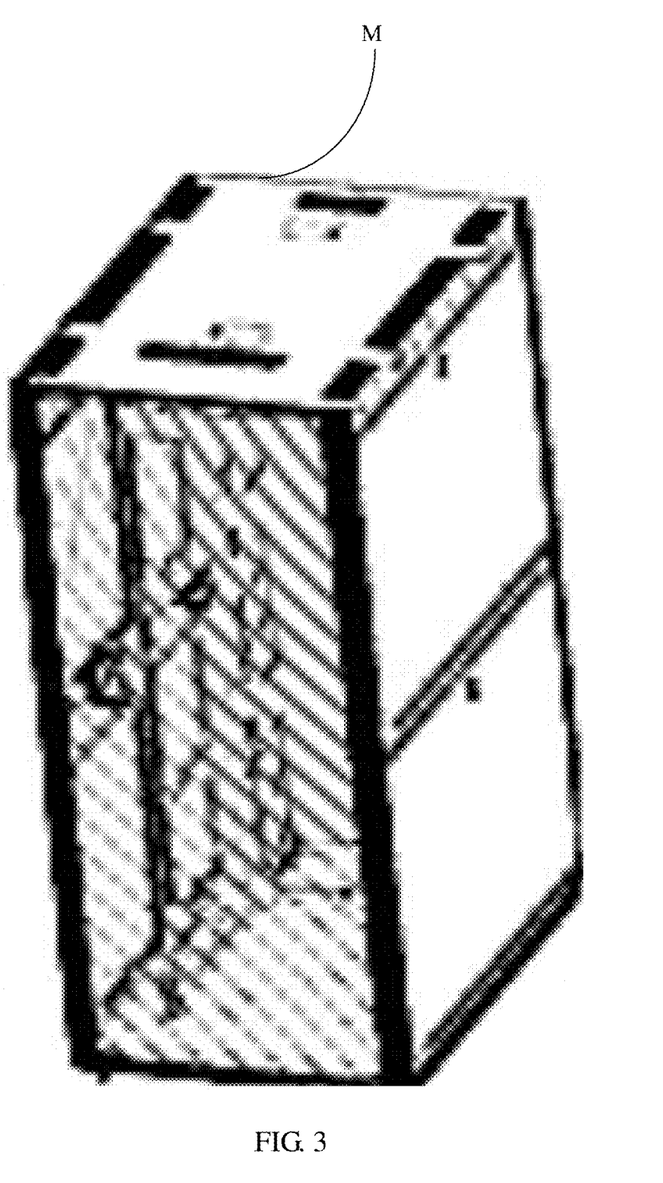
FIG. 3 is a schematic structural diagram of a cabinet according to a related technology.

FIG. 1 is a schematic structural diagram of a liquid cooling module 0 according to a related technology, FIG. 2 is a schematic diagram of a partial structure of a liquid cooling module 0 according to a related technology, and FIG. 3 is a schematic structural diagram of a cabinet M according to a related technology. Referring to FIG. 1, FIG. 2, and FIG. 3, the liquid cooling module 0 may be disposed in the cabinet M shown in FIG. 3, and communicates with both a liquid cooling source (not shown in FIG. 1, FIG. 2, or FIG. 3) and a cooling tube in a blade server (not shown in FIG. 2) disposed in the cabinet M. The blade server may generate excessive heat during running, therefore, a liquid cooling device is required for cooling the blade server in the cabinet M.

In the related technology, a liquid cooling device may include a liquid cooling module 0 and a liquid cooling source. The liquid cooling module 0 may include a rigid tube 01 and a flexible tube 02, the rigid tube 01 includes an inlet rigid tube and an outlet rigid tube, the flexible tube 02 may include an inlet flexible tube and an outlet flexible tube, the rigid tube 01 may be securely disposed in a cabinet M, both one end of the inlet rigid tube and one end of the outlet rigid tube communicate with the liquid cooling source, one end of the flexible tube 02 communicates with a side wall of the rigid tube 01 in a sealed manner by using a welded joint 03, and the other end of the inlet flexible tube and the other end of the outlet flexible tube communicate with both ends of a cooling tube in a blade server, respectively. The liquid cooling source can import coolant to the inlet rigid tube, allowing the coolant to sequentially pass through the inlet flexible tube, the cooling tube, the outlet flexible tube, and the outlet rigid tube, and then return to the liquid cooling source. When the coolant passes through the cooling tube, the coolant can absorb heat generated by the blade server, thereby effectively cooling the blade server. When the flexible tube 02 communicates with the rigid tube 01 in a sealed manner by using the welded joint 03, the flexible tube 02 is coupled with a sealing ring 04 and connected to a thread of the welded joint 03, and the welded joint 03 is welded to the rigid tube 01, so that a sealed connection is formed between the welded joint 03 and the flexible tube 02, and between the welded joint 03 and the rigid tube 01. In other words, the flexible tube 02 can communicate with the rigid tube 01 in a sealed manner only after two sealed connections. If either sealed connection fails, coolant leakage may occur when the coolant flows between the rigid tube 01 and the flexible tube 02, affecting normal operation of the liquid cooling device.

Figure 4:
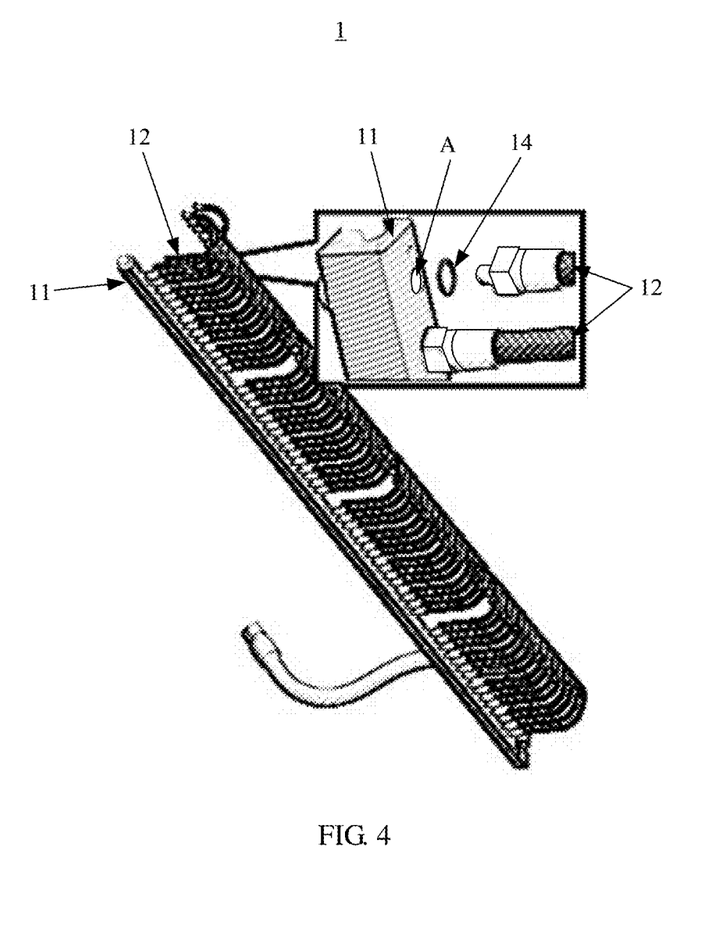
FIG. 4 is a schematic structural diagram of a liquid cooling module according to an embodiment of the present disclosure.

As shown in FIG. 4, an embodiment of the present disclosure provides a liquid cooling module 1. The liquid cooling module 1 may include a rigid tube 11 and a flexible tube 12. The rigid tube 11 is securely disposed in a cabinet (not shown in FIG. 4) and communicates with a liquid cooling source (not shown in FIG. 4), and a through hole A is opened in a side wall of the rigid tube 11 and passes through the side wall. One end of the flexible tube 12 is in contact with the rigid tube 11 and communicates with the rigid tube 11 in a sealed manner by using the through hole A, and the other end of the flexible tube 12 communicates with a cooling tube in a blade server (not shown in FIG. 4).

To sum up, this embodiment of the present disclosure provides a liquid cooling module. The through hole passing through the side wall is opened in the side wall of the rigid tube in the liquid cooling module, and one end of the flexible tube is in contact with the rigid tube and communicates with the rigid tube in a sealed manner by using the through hole. In other words, the rigid tube can communicate with the flexible tube in a sealed manner with only one sealed connection. This reduces a possibility of a sealed connection failure, decreases a probability of coolant leakage occurring when the coolant flows between the rigid tube and the flexible tube, and increases a probability of normal operation of the liquid cooling device.

It should be noted that a blade server may be disposed in the cabinet, a cooling tube may be disposed in the blade server, a quick connector may be disposed on both ends of the cooling tube, respectively, and the flexible tube may communicate with the cooling tube by using the quick connector.

Figure 5:
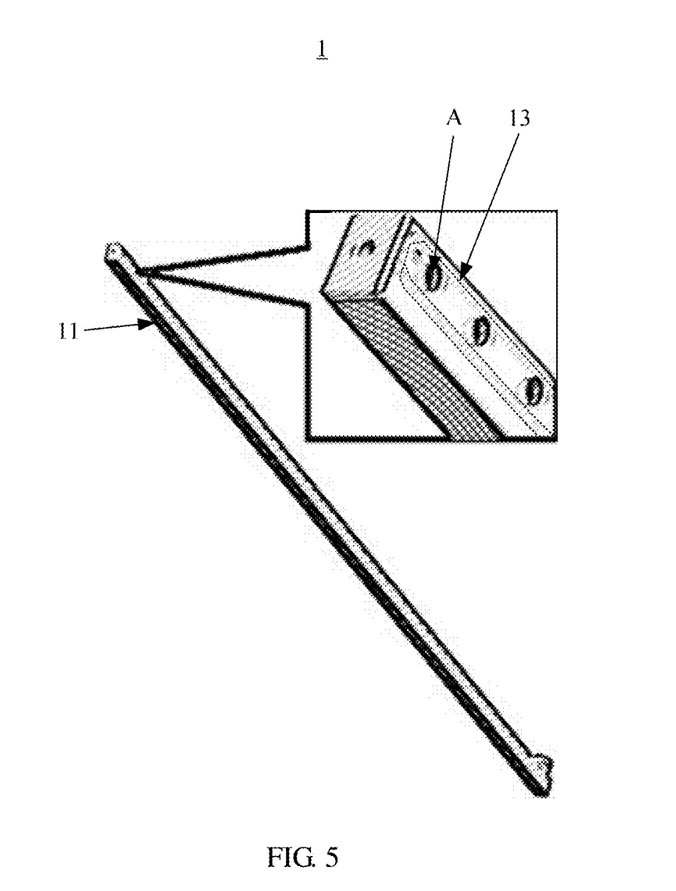
FIG. 5 is a schematic diagram of a partial structure of a liquid cooling module according to an embodiment of the present disclosure.

FIG. 5 is a schematic diagram of a partial structure of a liquid cooling module 1 according to an embodiment of the present disclosure. With reference to FIG. 4 and FIG. 5, the liquid cooling module 1 may further include a nut strip 13 securely disposed on an inner wall of the rigid tube 11, and a sealing ring 14 disposed on one end of the flexible tube 12. The nut strip 13 may be parallel to the rigid tube 11 in a length direction, the nut strip 13 is provided with a tapped hole (not shown in FIG. 5) passing through the nut strip 13 and the tapped hole communicates with the through hole A, one end of the flexible tube 12 is connected to the tapped hole through threads by using the through hole A, and the sealing ring 14 is located between the flexible tube 12 and the through hole A.

Figure 6:
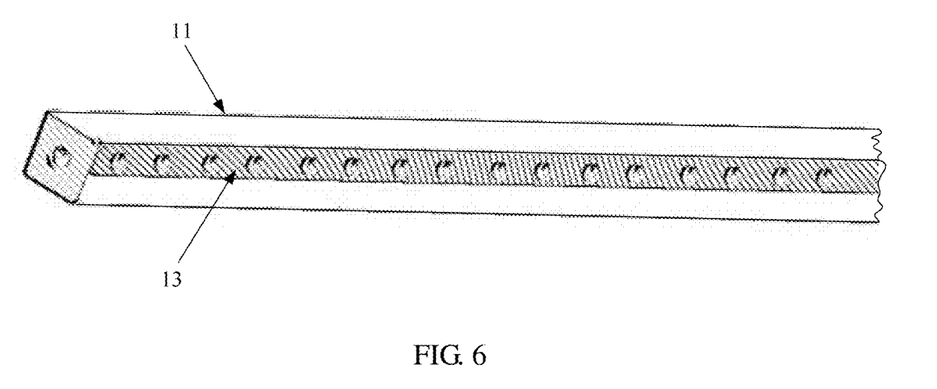
FIG. 6 is a schematic structural diagram of a rigid tube according to an embodiment of the present disclosure.

Optionally, as shown in FIG. 6, the rigid tube 11 in the liquid cooling module according to this embodiment of the present disclosure may be a rectangular tube, the rectangular tube may have four inner walls, and the nut strip 13 may be disposed on one of the four inner walls of the rectangular tube. In a related technology, a rigid tube in a liquid cooling module is a circular tube. Because the circular tube requires a large amount of welding and air tightness is difficult to control, when a welded joint is welded to the rigid tube, a relatively large quantity of welding positions is required, the rigid tube is subjected to a relatively large deformation, and straightness of the rigid tube is hard to control. In this embodiment of the present disclosure, the rigid tube is a rectangular tube, the nut strip needs to be welded only inside the rigid tube (that is, both ends of the nut strip are welded to inner walls of the rigid tube), and relatively few welding positions are required for welding the nut strip (only two welding positions are required). This reduces a quantity of welding positions and mitigates rigid tube deformation resulting from heating.

Further, in the related technology, a relatively large quantity of welded joints is welded sequentially to the rigid tube. If the rigid tube cannot be used in case of damage during a welding process, the rigid tube needs to be replaced, therefore, manufacturing costs are relatively high. In this embodiment of the present disclosure, relatively few positions need to be welded during a welding process, and if the nut strip cannot be used due to a manufacturing failure during a nut strip manufacturing process, the nut strip can be replaced directly. Costs of the nut strip are relatively low, thereby reducing manufacturing costs.

Figure 7:
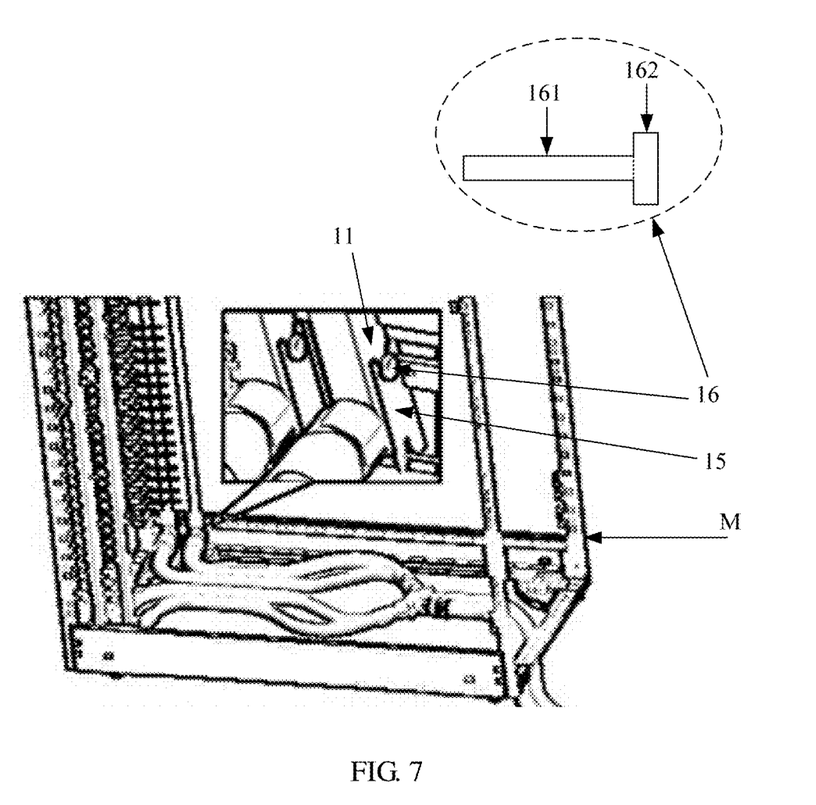
FIG. 7 is a schematic diagram of a partial structure of another liquid cooling module according to an embodiment of the present disclosure.

FIG. 7 is a schematic diagram of a partial structure of another liquid cooling module 1 according to an embodiment of the present disclosure. As shown in FIG. 7, the liquid cooling module 1 may further include a clamping part 15 securely disposed in a cabinet M, and a pin 16 securely disposed on a side wall of a rigid tube 11. The pin 16 may include a pin body 161 and a protruding structure 162 disposed on the pin body 161 and away from one end of the rigid tube 11. A cross-sectional area of the protruding structure 162 vertical to a length direction of the pin body 161 is greater than a cross-sectional area of the pin body 161 vertical to the length direction of the pin body 161, and the clamping part 15 is clamped to the pin body 161 and is located between the rigid tube 11 and the protruding structure 162. In other words, the rigid tube is securely disposed in the cabinet M by using the clamping part 15 and the pin 16.

Figure 8:
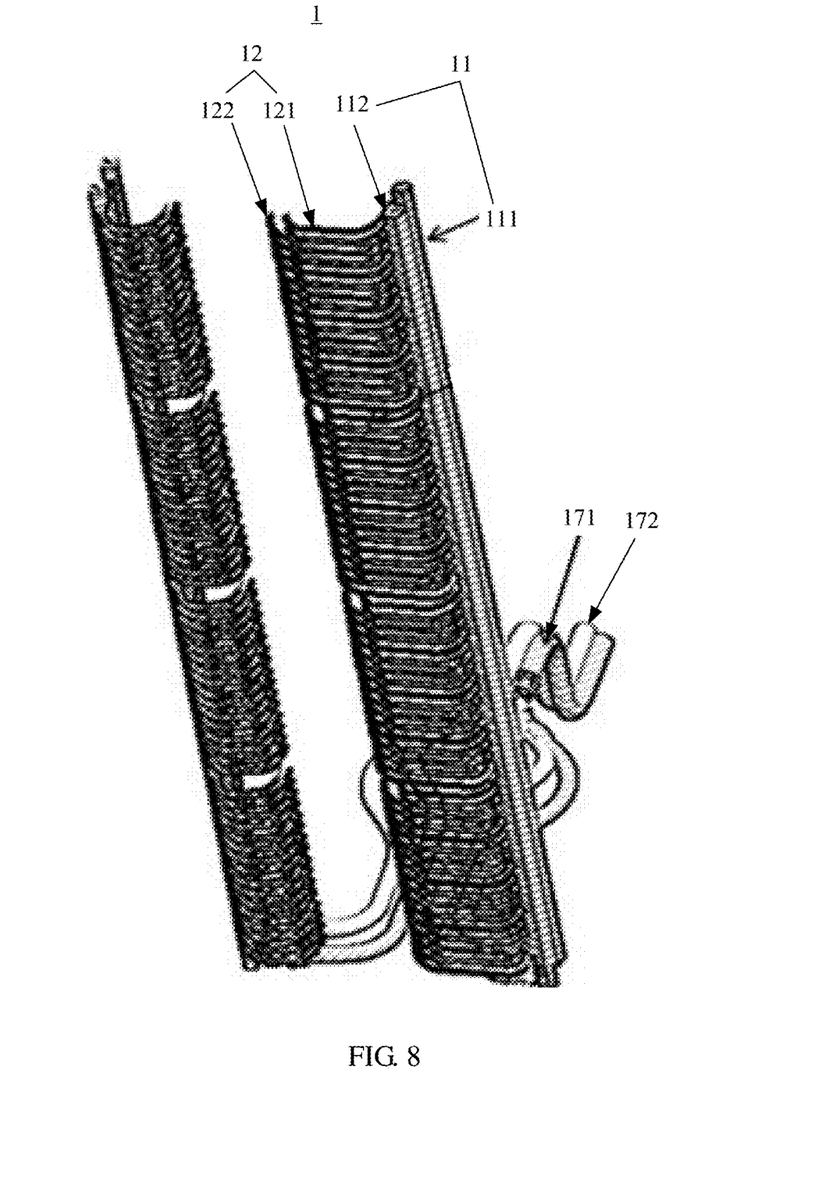
FIG. 8 is a schematic structural diagram of another liquid cooling module according to an embodiment of the present disclosure.

FIG. 8 is a schematic structural diagram of another liquid cooling module 1 according to an embodiment of the present disclosure. As shown in FIG. 8, a rigid tube 11 may include an inlet rigid tube 111 and an outlet rigid tube 112, and a flexible tube 12 includes an inlet flexible tube 121 and an outlet flexible tube 122. The liquid cooling module 1 may further include a first manifold flexible tube 171 and a second manifold flexible tube 172. The inlet rigid tube 111 communicates with a liquid cooling source by using the first manifold flexible tube 171, and the outlet rigid tube 112 communicates with the liquid cooling source by using the second manifold flexible tube 172.

Further, the inlet rigid tube in and the outlet rigid tube 112 communicate with the liquid cooling source, one end of the inlet flexible tube 121 communicates with the inlet rigid tube 111 in a sealed manner by using a through hole on a side wall of the inlet rigid tube 111, one end of the outlet flexible tube 122 communicates with the outlet rigid tube 112 in a sealed manner by using a through hole on a side wall of the outlet rigid tube 112, and the other end of the inlet flexible tube 121 and the other end of the outlet flexible tube 122 communicate with both ends of a cooling tube, respectively.

Figure 9:
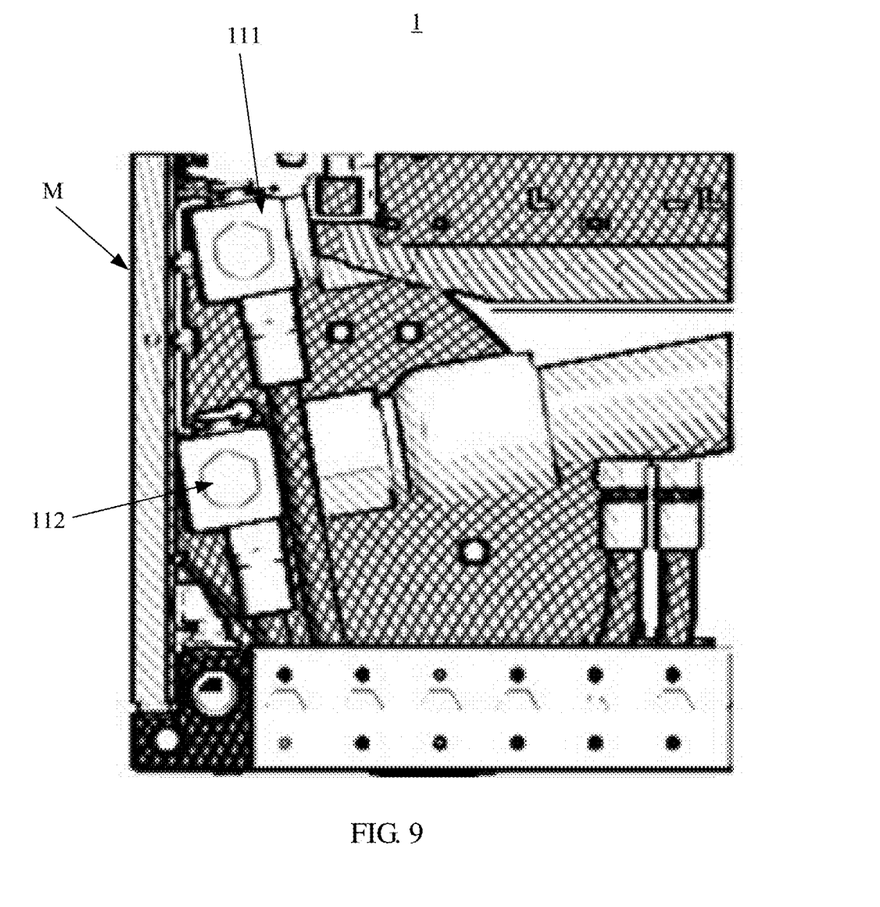
FIG. 9 is a schematic diagram of a partial structure of still another liquid cooling module according to an embodiment of the present disclosure.

Further, FIG. 9 is a schematic diagram of a partial structure of still another liquid cooling module 1 according to an embodiment of the present disclosure. As shown in FIG. 9, an inner wall of a cabinet M close to a rigid tube is a preset inner wall, any side wall of an inlet rigid tube 111 is a first preset side wall, any side wall of an outlet rigid tube 112 is a second preset side wall, the inlet rigid tube 111 and the outlet rigid tube 112 are both in contact with the preset inner wall, an angle between the preset inner wall and the first preset side wall is greater than 0 degrees and less than 90 degrees, and an angle between the preset inner wall and the second preset side wall is greater than 0 degrees and less than 90 degrees.

Figure 10:
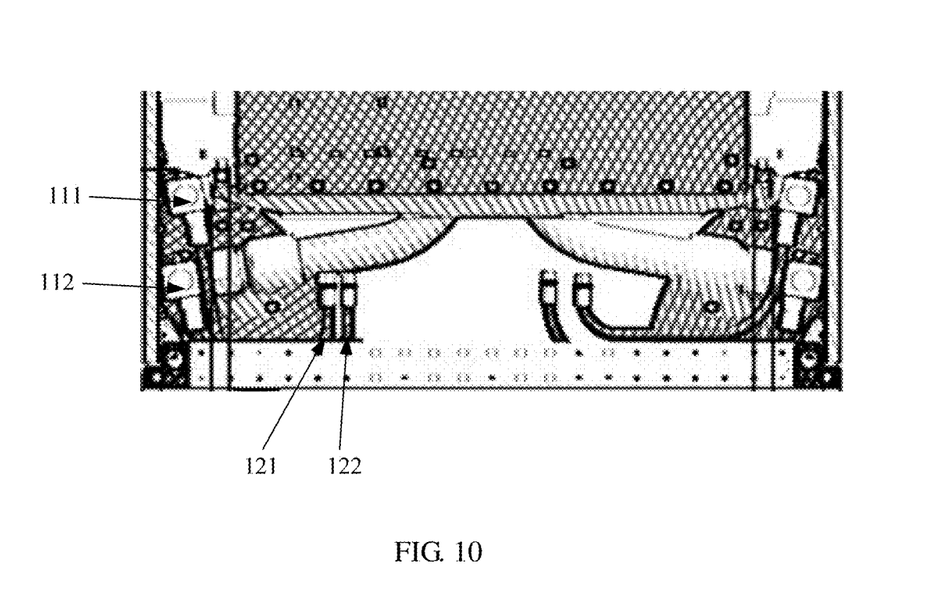
FIG. 10 is a schematic diagram of an application scenario of a liquid cooling module according to an embodiment of the present disclosure.

Referring to FIG. 10, in this embodiment of the present disclosure, the inlet rigid tube 111 and the outlet rigid tube 112 are both disposed against the preset inner wall of the cabinet. To ensure sufficient space for arranging the inlet flexible tube 121 connected to the inlet rigid tube 111 and the outlet flexible tube 122 connected to the outlet rigid tube 112, the inlet rigid tube 111 and the outlet rigid tube 112 are specially disposed to tilt at an angle, so that the inlet flexible tube 121 and the outlet flexible tube 122 can be arranged in sufficient space on a premise that the inlet rigid tube 111 and the outlet rigid tube 112 are both disposed against the preset inner wall. In addition, because the inlet rigid tube 111 and the outlet rigid tube 112 are both disposed against the preset inner wall, a width of the liquid cooling module is relatively small, and the liquid cooling module can be placed in a cabinet with a width of 600 millimeters. In a related technology, because an inlet rigid tube and an outlet rigid tube are arranged in parallel, and only one rigid tube is disposed against a cabinet while the other rigid tube is not disposed against the cabinet, a liquid cooling module is relatively wide and can be placed only in a cabinet with a width of 800 millimeters, but cannot be placed in a cabinet with a width of 600 millimeters. A cabinet with a width of 800 millimeters is relatively large, and equipment room space utilization is relatively low. However, a cabinet with a width of 600 millimeters is relatively small, and equipment room space utilization is relatively high.

Figure 11:
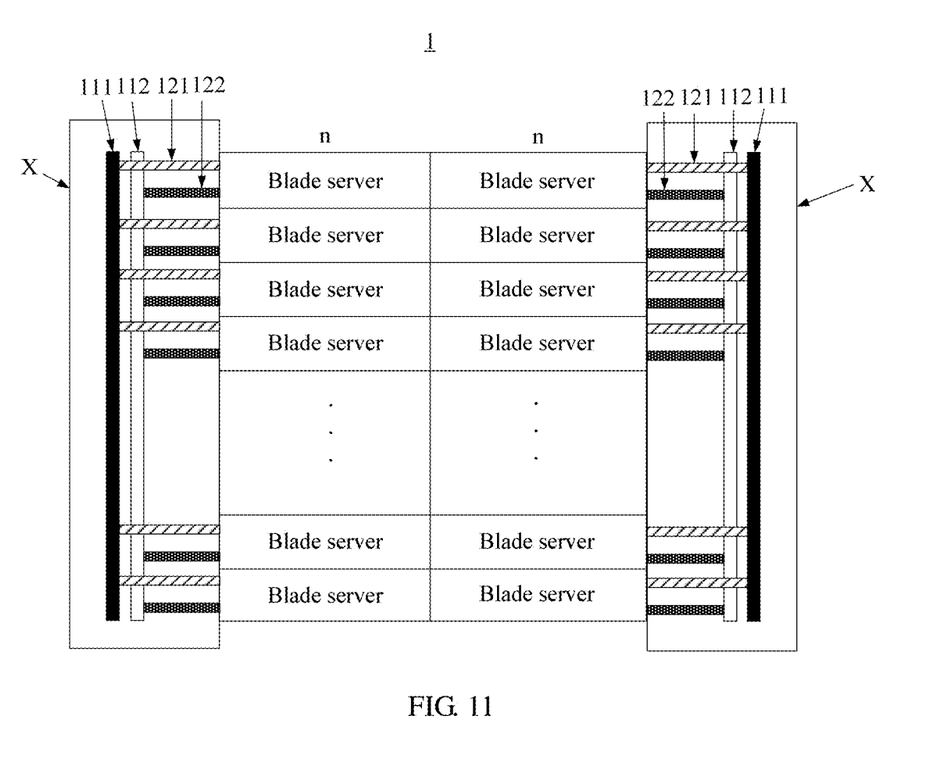
FIG. 11 is a schematic diagram of an application scenario of another liquid cooling module according to an embodiment of the present disclosure.

Optionally, referring to FIG. 11, 2n blade servers may be disposed in a cabinet. A liquid cooling module 1 in this embodiment of the present disclosure may include two liquid cooling submodules X. Each liquid cooling submodule X may include one inlet rigid tube 111, one outlet rigid tube 112, n inlet flexible tubes 121, n outlet flexible tubes 122, n first sealing rings, and n second sealing rings. n first through holes are opened in a side wall of the inlet rigid tube 111, n first tapped holes are disposed on a nut strip on an inner wall of the inlet rigid tube 111, n second through holes are opened in a side wall of the outlet rigid tube 112, and n second tapped holes are disposed on a nut strip on an inner wall of the outlet rigid tube 112, where n is an integer greater than or equal to 1. The n inlet flexible tubes 121 and the n outlet flexible tubes 122 are in one-to-one correspondence, the n inlet flexible tubes 121, the n first sealing rings, the n first through holes, and the n first tapped holes are in one-to-one correspondence, and the n outlet flexible tubes 122, the n second sealing rings, the n second through holes, and the n second tapped holes are in one-to-one correspondence. One end of each flexible tube is coupled with a corresponding sealing ring, and is connected to a corresponding tapped hole through threads by using a corresponding through hole. The other end of each inlet flexible tube and the other end of a corresponding outlet flexible tube communicate with both ends of a cooling tube in a same blade server, respectively. Any two inlet flexible tubes in the liquid cooling module communicate with different cooling tubes.

For example, the rigid tubes (such as the inlet rigid tube and the outlet rigid tube) in this embodiment of the present disclosure may all be steel tubes, a width of the cabinet may be 600 millimeters, a length of each nut strip may be 500 millimeters, and a maximum outer diameter of a tapped hole on the nut strip may be 8 millimeters.

To sum up, this embodiment of the present disclosure provides a liquid cooling module. The through hole passing through the side wall is opened in the side wall of the rigid tube in the liquid cooling module, and one end of the flexible tube is in contact with the rigid tube and communicates with the rigid tube in a sealed manner by using the through hole. In other words, the rigid tube can communicate with the flexible tube in a sealed manner with only one sealed connection. This reduces a possibility of a sealed connection failure, decreases a probability of coolant leakage occurring when the coolant flows between the rigid tube and the flexible tube, and increases a probability of normal operation of the liquid cooling device.

An embodiment of the present disclosure provides a liquid cooling device. The liquid cooling device may include a liquid cooling source and a liquid cooling module, and the liquid cooling module may be a liquid cooling module shown in FIG. 4, FIG. 5, FIG. 7, FIG. 8, FIG. 9, FIG. 10, or FIG. 11.

Figure 12:
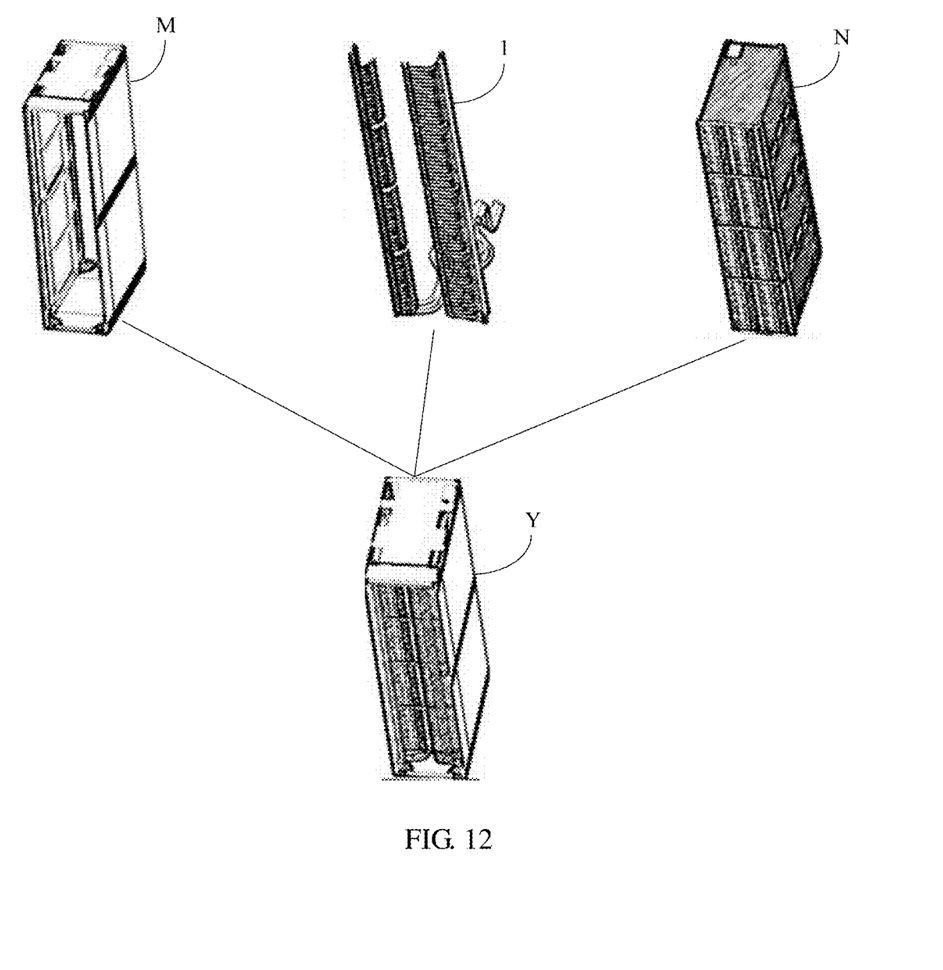
FIG. 12 is a schematic diagram of an application scenario of still another liquid cooling module according to an embodiment of the present disclosure.

As shown in FIG. 12, a liquid cooling module 1 may be disposed in a cabinet M, a server module N including a plurality of blade servers may also be disposed in the cabinet M, and the cabinet M, the liquid cooling module 1, and the server module N can form a liquid cooling cabinet Y.

To sum up, this embodiment of the present disclosure provides a liquid cooling device. A through hole passing through a side wall is opened in a side wall of a rigid tube in the liquid cooling module of the liquid cooling device, and one end of a flexible tube is in contact with the rigid tube and communicates with the rigid tube in a sealed manner by using the through hole. In other words, the rigid tube can communicate with the flexible tube in a sealed manner with only one sealed connection. This reduces a possibility of a sealed connection failure, decreases a probability of coolant leakage occurring when the coolant flows between the rigid tube and the flexible tube, and increases a probability of normal operation of the liquid cooling device.

The foregoing descriptions are merely example embodiments of the present disclosure, but are not intended to limit the present disclosure. Any modification, equivalent replacement, and improvement made without departing from the spirit and principle of the present disclosure shall fall within the protection scope of the present disclosure.

What is claimed is:

1. A liquid cooling apparatus, comprising:
    a first rigid tube;
    a first flexible tube;
    a nut strip; and
    a sealing ring;
    wherein the first rigid tube is securely disposed in a cabinet and is connected to a liquid cooling source, and wherein a through hole is disposed in a side wall of the first rigid tube and extends through the side wall, wherein the side wall of the first rigid tube is a flat wall of the first rigid tube;
    wherein a first end of the first flexible tube is connected to the first rigid tube and provides a sealed passage with the first rigid tube by way of the through hole, and wherein a second end of the first flexible tube opposite the first end connects the first flexible tube to a cooling tube in a blade server;
    wherein the nut strip is securely disposed at an interior face of the side wall of the first rigid tube, wherein the nut strip extends along, and parallel to, the first rigid tube, wherein the nut strip has a tapped hole passing through the nut strip, and wherein the tapped hole extends to, and is aligned with, the through hole; and
    wherein the first end of the first flexible tube extends through the side wall of the first rigid tube to the nut strip and is connected to the tapped hole by way of threads of the nut strip, wherein the sealing ring is coupled on the first end of the first flexible tube, and wherein the sealing ring is disposed between the first flexible tube and a flat outside face of the side wall of the first rigid tube.

2. The liquid cooling apparatus according to claim 1, wherein the first rigid tube is a rectangular tube.

3. The liquid cooling apparatus according to claim 1, wherein the liquid cooling apparatus further comprises:
    a clamping part securely disposed in the cabinet; and
    a pin securely disposed on the side wall, wherein the pin comprises a pin body and a protruding structure that is disposed on the pin body and that is disposed away from the first end of the first rigid tube; and
    wherein a first cross-sectional area of the protruding structure in a first direction that is parallel to a vertical axis of the pin body is greater than a second cross-sectional area of the pin body in the first direction, and wherein the clamping part is clamped to the first rigid tube by the pin and is disposed between the first rigid tube and the protruding structure.

4. The liquid cooling apparatus according to claim 1, wherein the first rigid tube is a first one of an inlet rigid tube and an outlet rigid tube, and wherein the liquid cooling apparatus further comprises a second rigid tube that is an other one of the inlet rigid tube and the outlet rigid tube;
    wherein the first flexible tube is a first one of an inlet flexible tube and an outlet flexible tube, and wherein the liquid cooling apparatus further comprises a second flexible tube that is an other one of the inlet flexible tube and the outlet flexible tube;
    wherein a first end of the second flexible tube is connected to the second rigid tube provides a sealed passage with the second rigid tube by way of a through hole in the second rigid tube;
    wherein the inlet rigid tube and the outlet rigid tube are both connected to the liquid cooling source; and
    wherein a first end of the second flexible tube is connected to the second rigid tube and provides a sealed passage with the second rigid tube by way of a through hole on a side wall of the second rigid tube, and wherein the second end of the first flexible tube is connected to a first end of the cooling tube, and wherein a second end of the second flexible tube is connected to a second end of the cooling tube.

5. The liquid cooling apparatus according to claim 4, wherein the inlet rigid tube and the outlet rigid tube are both in contact with an inner wall of the cabinet, wherein an angle between the inner wall and a first side wall of the cabinet is greater than 0 degrees and less than 90 degrees, and wherein an angle between the inner wall and a second side wall of the cabinet is greater than 0 degrees and less than 90 degrees.

6. The liquid cooling apparatus according to claim 4, wherein 2n blade servers are disposed in the cabinet, wherein n is an integer greater than or equal to 1, and wherein the liquid cooling apparatus comprises at least two liquid cooling sub-apparatuses;
    wherein each liquid cooling sub-apparatus of the at least two liquid cooling sub-apparatuses comprises one inlet rigid tube, one outlet rigid tube, n inlet flexible tubes, n outlet flexible tubes, n first sealing rings, and n second sealing rings;
    wherein n first through holes are disposed in a side wall of the inlet rigid tube, wherein n first tapped holes are disposed on a nut strip on an inner wall of the inlet rigid tube, wherein n second through holes are disposed in a side wall of the outlet rigid tube, and wherein n second tapped holes are disposed on a nut strip on an inner wall of the outlet rigid tube;
    wherein the n inlet flexible tubes and the n outlet flexible tubes are in one-to-one correspondence, the n inlet flexible tubes, the n first sealing rings, the n first through holes, and the n first tapped holes are in one-to-one correspondence, and wherein the n outlet flexible tubes, the n second sealing rings, the n second through holes, and the n second tapped holes are in one-to-one correspondence;
    wherein a first end of each inlet flexible tube of the n inlet flexible tubes is coupled, with a corresponding sealing ring of the n first sealing rings, to a corresponding tapped hole of the n first tapped holes by way of threads associated with a corresponding first through hole of the n first through holes;

wherein a first end of each outlet flexible tube of the n outlet flexible tubes is coupled, with a corresponding sealing ring of the n second sealing rings, to a corresponding tapped hole of the n second tapped holes by way of threads associated with a corresponding second through hole of the n second through holes; and wherein a second end of each inlet flexible tube and a second end of a corresponding outlet flexible tube communicate with both ends of a cooling tube in a same blade server, respectively, and wherein each inlet flexible tube of the n inlet flexible tubes in the liquid cooling apparatus communicate with different cooling tubes.

7. The liquid cooling apparatus according to claim 4, wherein the liquid cooling apparatus further comprises a first manifold flexible tube and a second manifold flexible tube; and wherein the inlet rigid tube is connected to the liquid cooling source by the first manifold flexible tube, and wherein the outlet rigid tube is connected to the liquid cooling source by the second manifold flexible tube.

8. The liquid cooling apparatus according to claim 1, wherein the first rigid tube is a steel tube; and wherein a width of the cabinet is about 600 millimeters, wherein a length of the nut strip is about 500 millimeters, and a maximum outer diameter of the tapped hole is about 8 millimeters.

9. A liquid cooling device, comprising:

a liquid cooling source; and a liquid cooling apparatus, wherein the liquid cooling apparatus comprises a first rigid tube, a first flexible tube, a nut strip, and a sealing ring;

wherein the first rigid tube is securely disposed in a cabinet and is connected to the liquid cooling source, and wherein a through hole is disposed in a side wall of the first rigid tube and extends through the side wall, wherein the side wall of the first rigid tube is a flat wall of the first rigid tube;

wherein a first end of the first flexible tube is connected to the first rigid tube and provides a sealed passage with the first rigid tube by way of the through hole, and wherein a second end of the first flexible tube opposite the first end connects the first flexible tube to a cooling tube in a blade server;

wherein the nut strip is securely disposed at an interior face of the side wall of the first rigid tube, wherein the nut strip extends along, and parallel to, the first rigid tube, wherein the nut strip has a tapped hole passing through the nut strip, and wherein the tapped hole extends to, and is aligned with, the through hole; and wherein the first end of the first flexible tube extends through the side wall of the first rigid tube to the nut strip and is connected to the tapped hole by way of threads of the nut strip, wherein the sealing ring is coupled on the first end of the first flexible tube, and wherein the sealing ring is disposed between the first flexible tube and a flat outside face of the side wall of the first rigid tube.

10. The liquid cooling device according to claim 9, wherein
the first rigid tube is a rectangular tube.

11. The liquid cooling device according to claim 9, wherein the liquid cooling apparatus further comprises:

a clamping part securely disposed in the cabinet; and a pin securely disposed on the side wall, wherein the pin comprises a pin body and a protruding structure that is disposed on the pin body and that is disposed away from the first end of the first rigid tube; and wherein a first cross-sectional area of the protruding structure in a first direction that is parallel to a vertical axis of the pin body is greater than a second cross-sectional area of the pin body in the first direction, and wherein the clamping part is clamped to the first rigid tube by the pin and is disposed between the first rigid tube and the protruding structure.

12. The liquid cooling device according to claim 9, wherein the first rigid tube is a first one of an inlet rigid tube and an outlet rigid tube, and wherein the liquid cooling apparatus further comprises a second rigid tube that is an other one of the inlet rigid tube and the outlet rigid tube;

wherein the first flexible tube is a first one of an inlet flexible tube and an outlet flexible tube, and wherein the liquid cooling apparatus further comprises a second flexible tube that is an other one of the inlet flexible tube and the outlet flexible tube;

wherein a first end of the second flexible tube is connected to the second rigid tube provides a sealed passage with the second rigid tube by way of a through hole in the second rigid tube;

wherein the inlet rigid tube and the outlet rigid tube are both connected to the liquid cooling source; and wherein a first end of the second flexible tube is connected to the second rigid tube and provides a sealed passage with the second rigid tube by way of a through hole on a side wall of the second rigid tube, and wherein the second end of the first flexible tube is connected to a first end of the cooling tube, and wherein a second end of the second flexible tube is connected to a second end of the cooling tube.

13. The liquid cooling device according to claim 12, wherein the inlet rigid tube and the outlet rigid tube are both in contact with an inner wall of the cabinet, wherein an angle between the inner wall and a first side wall of the cabinet is greater than 0 degrees and less than 90 degrees, and wherein an angle between the inner wall and a second side wall of the cabinet is greater than 0 degrees and less than 90 degrees.

14. The liquid cooling device according to claim 12, wherein 2n blade servers are disposed in the cabinet, wherein n is an integer greater than or equal to 1, and wherein the liquid cooling apparatus comprises at least two liquid cooling sub-apparatuses;

wherein each liquid cooling sub-apparatus of the at least two liquid cooling sub-apparatuses comprises one inlet rigid tube, one outlet rigid tube, n inlet flexible tubes, n outlet flexible tubes, n first sealing rings, and n second sealing rings;

wherein n first through holes are disposed in a side wall of the inlet rigid tube, wherein n first tapped holes are disposed on a nut strip on an inner wall of the inlet rigid tube, wherein n second through holes are disposed in a side wall of the outlet rigid tube, and wherein n second tapped holes are disposed on a nut strip on an inner wall of the outlet rigid tube;

wherein the n inlet flexible tubes and the n outlet flexible tubes are in one-to-one correspondence, the n inlet flexible tubes, the n first sealing rings, the n first through holes, and the n first tapped holes are in one-to-one correspondence, and wherein the n outlet flexible tubes, the n second sealing rings, the n second through holes, and the n second tapped holes are in one-to-one correspondence;

wherein a first end of each inlet flexible tube of the n inlet flexible tubes is coupled, with a corresponding sealing ring of the n first sealing rings, to a corresponding tapped hole of the n first tapped holes by way of threads associated with a corresponding first through hole of the n first through holes;

wherein a first end of each outlet flexible tube of the n outlet flexible tubes is coupled, with a corresponding sealing ring of the n second sealing rings, to a corresponding tapped hole of the n second tapped holes by way of threads associated with a corresponding second through hole of the n second through holes; and wherein a second end of each inlet flexible tube and a second end of a corresponding outlet flexible tube communicate with both ends of a cooling tube in a same blade server, respectively, and wherein each inlet flexible tube of the n inlet flexible tubes in the liquid cooling apparatus communicate with different cooling tubes.

15. The liquid cooling device according to claim 12, wherein the liquid cooling apparatus further comprises a first manifold flexible tube and a second manifold flexible tube; and wherein the inlet rigid tube is connected to the liquid cooling source by the first manifold flexible tube, and wherein the outlet rigid tube is connected to the liquid cooling source by the second manifold flexible tube.

16. The liquid cooling device according to claim 9, wherein the first rigid tube is a steel tube; and wherein a width of the cabinet is about 600 millimeters, wherein a length of the nut strip is about 500 millimeters, and a maximum outer diameter of the tapped hole is about 8 millimeters.

17. An apparatus, comprising:
a cabinet;
a liquid cooling source; and
a liquid cooling apparatus, wherein the liquid cooling apparatus comprises a first rigid tube and a first flexible tube; and
one or more liquid cooling sub-assemblies, each liquid cooling sub-assembly of the one or more liquid cooling sub-assemblies comprising:
  a rigid tube securely disposed in the cabinet, wherein a through hole is disposed in a side wall of the first rigid tube and extends through the side wall to a rigid tube cavity in the rigid tube, wherein the side wall of the rigid tube is a flat wall of the rigid tube, and wherein the rigid tube is connected to the liquid cooling source;
  a flexible tube having a first end connected to the side wall of the first rigid tube, the flexible tube further having a flexible tube cavity that is contiguous with the rigid tube cavity by way of the through hole, the flexible tube further having a second end opposite the first end, the second end configured to connect the flexible tube to a cooling tube in a blade server;
  a nut strip securely disposed at an interior face of the side wall of the rigid tube, wherein the nut strip has a tapped hole passing through the nut strip; and
  a sealing ring coupled on the first end of the flexible tube; and
wherein the flexible tube provides a sealed passage between the rigid tube cavity and the second end by way of the flexible tube cavity, wherein the first end of the flexible tube extends through the side wall of the first rigid tube to the nut strip and is connected to the tapped hole by way of threads of the nut strip, wherein the sealing ring is coupled on the first end of the flexible tube, wherein the nut strip extends along, and parallel to, the rigid tube, and wherein the tapped hole extends to, and is aligned with, the through hole, and wherein the sealing ring is disposed between the flexible tube and a flat outside face of the side wall of the rigid tube.

18. The apparatus according to claim 17, further comprising:
2n blade servers disposed in the cabinet, wherein n is an integer greater than or equal to 1;
at least two liquid cooling sub-apparatuses, each liquid cooling sub-apparatus of the at least two liquid cooling sub-apparatuses comprising an inlet liquid cooling sub-assembly of the one or more liquid cooling sub-assemblies and an outlet liquid cooling sub-assembly of the one or more liquid cooling sub-assemblies;
wherein the inlet liquid cooling sub-assembly has n inlet through holes disposed in the side wall of the rigid tube of the inlet liquid cooling sub-assembly, wherein n first tapped holes are disposed on a nut strip on an inner wall of the rigid tube of the inlet liquid cooling sub-assembly, and wherein the inlet liquid cooling sub-assembly has n flexible tubes that are each coupled, with a corresponding sealing ring, to a corresponding tapped hole of the n first tapped holes by way of threads associated with a corresponding first through hole of the n first through holes;
wherein the outlet liquid cooling sub-assembly has n second through holes disposed in the side wall of the rigid tube of the outlet liquid cooling sub-assembly, and wherein n second tapped holes are disposed on a nut strip on an inner wall of the rigid tube of the outlet liquid cooling sub-assembly, and wherein the outlet liquid cooling sub-assembly has n outlet flexible tubes that are each coupled, with a corresponding sealing ring, to a corresponding tapped hole of the n second tapped holes by way of threads associated with a corresponding second through hole of the n second through holes; and
wherein each second end of each flexible tube of the inlet liquid cooling sub-assembly and a second end of a corresponding flexible tube of the inlet liquid cooling sub-assembly are coupled to a cooling system in a same blade server.

19. The liquid cooling apparatus according to claim 1, wherein the through hole disposed in the side wall of the first rigid tube is unthreaded.

20. The liquid cooling device according to claim 9, wherein the through hole disposed in the side wall of the first rigid tube is unthreaded.

* * * * *